US009041905B2

(12) United States Patent
Ehm et al.

(10) Patent No.: US 9,041,905 B2
(45) Date of Patent: May 26, 2015

(54) OPTICAL ARRANGEMENT, IN PARTICULAR IN A PROJECTION EXPOSURE APPARATUS FOR EUV LITHOGRAPHY

(75) Inventors: Dirk Heinrich Ehm, Lauchheim (DE); Stefan-Wolfgang Schmidt, Aalen (DE); Guenther Dengel, Heidenheim (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 336 days.

(21) Appl. No.: 13/414,367

(22) Filed: Mar. 7, 2012

(65) Prior Publication Data

US 2012/0224153 A1 Sep. 6, 2012

Related U.S. Application Data

(63) Continuation of application No. PCT/EP2010/062819, filed on Sep. 1, 2010.

(60) Provisional application No. 61/240,361, filed on Sep. 8, 2009.

(30) Foreign Application Priority Data

Sep. 8, 2009 (DE) .......................... 10 2009 029 282

(51) Int. Cl.
*G03B 27/52* (2006.01)
*G03F 7/20* (2006.01)
(52) U.S. Cl.
CPC ........ *G03F 7/70933* (2013.01); *G03F 7/70808* (2013.01); *G03F 7/70825* (2013.01); *G03F 7/70916* (2013.01); *G03F 7/70983* (2013.01)
(58) Field of Classification Search
CPC .......................... G03F 7/70808; G03F 7/70825

USPC ...................................................... 355/30, 77
See application file for complete search history.

(56) References Cited

U.S. PATENT DOCUMENTS

2001/0028447 A1 10/2001 Hase et al.
2003/0197844 A1 10/2003 Mertens
(Continued)

FOREIGN PATENT DOCUMENTS

| DE | 102006044591 A1 | 4/2008 |
|---|---|---|
| WO | 2008034582 A2 | 3/2008 |
| WO | 2009104962 A1 | 8/2009 |
| WO | 2010025798 A1 | 3/2010 |

OTHER PUBLICATIONS

German Office Action dated Feb. 23, 2010 issued in German Application No. 10 2009 029282.9.

(Continued)

*Primary Examiner* — Deoram Persaud
(74) *Attorney, Agent, or Firm* — Edell, Shapiro & Finnan, LLC

(57) ABSTRACT

An optical arrangement, in particular in a projection exposure apparatus for EUV lithography. In an aspect an optical arrangement has a housing (100, 200, 550, 780) in which at least one optical element is arranged, and at least one subhousing (140, 240, 560, 790, 811, 823, 824, 831, 841) which is arranged within the housing and which surrounds at least one beam incident on the optical element in operation of the optical system, wherein the internal space of the subhousing is in communication with the external space of the subhousing by way of at least one opening, wherein provided in the region of the opening is at least one flow guide portion which deflects a flushing gas flow passing through the opening from the internal space to the external space of the subhousing, at least once in its direction.

28 Claims, 11 Drawing Sheets

(56) References Cited

U.S. PATENT DOCUMENTS

| | | |
|---|---|---|
| 2004/0227920 A1* | 11/2004 | Hara .................................. 355/67 |
| 2005/0030504 A1* | 2/2005 | Terashima et al. .............. 355/53 |
| 2005/0110966 A1 | 5/2005 | Hasegawa |
| 2005/0275821 A1* | 12/2005 | Miyajima ........................ 355/69 |
| 2006/0001958 A1* | 1/2006 | Hasegawa ...................... 359/443 |
| 2006/0017894 A1 | 1/2006 | Van Empel et al. |
| 2008/0001101 A1 | 1/2008 | Wilhelmus Van Herpen et al. |
| 2009/0135386 A1 | 5/2009 | Nishikawa |
| 2009/0141257 A1 | 6/2009 | Nishikawa |
| 2009/0231707 A1 | 9/2009 | Ehm et al. |
| 2011/0194091 A1* | 8/2011 | Kwan et al. ...................... 355/67 |
| 2012/0281196 A1* | 11/2012 | Loering et al. .................. 355/71 |

OTHER PUBLICATIONS

Taiwanese Office Action / Search Report dated Aug. 28, 2013 issued in Taiwanese Application No. 99130162.

International Preliminary Report on Patentability and Written Opinion dated Mar. 13, 2012 issued in International Application No. PCT/EP2010/062819.

Office Action for Taiwanese Patent Application No. 099130162, dated Mar. 5, 2014, 6 pages.

Korean Office Action for Korean Patent Application No. 10-2012-7006045 and dated Jan. 26, 2014.

* cited by examiner a)

b)

a)

b)

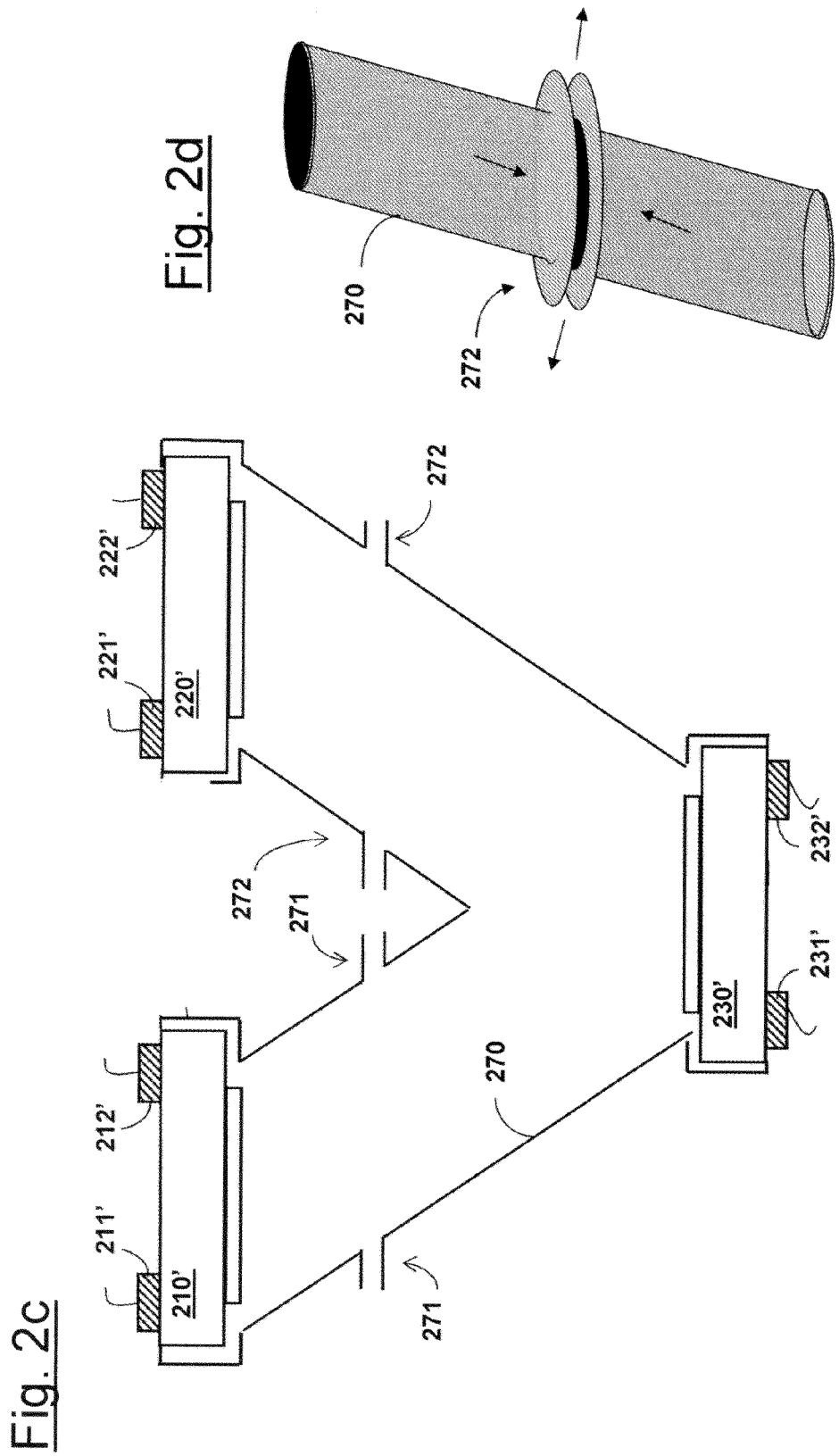

a)

b)

OPTICAL ARRANGEMENT, IN PARTICULAR IN A PROJECTION EXPOSURE APPARATUS FOR EUV LITHOGRAPHY

CROSS REFERENCE TO RELATED APPLICATIONS

This application is a Continuation of International Application Number PCT/EP2010/062819, filed on Sep. 1, 2010, which claims the benefit of U.S. Provisional Application No. 61/240,361, filed Sep. 8, 2009, as well as German Patent Application Number 10 2009 029 282.9, filed Sep. 8, 2009. The contents of these applications are hereby incorporated by reference into the present application in their entireties.

BACKGROUND OF THE INVENTION

Field of and Background of the Invention

The present invention concerns an optical arrangement, in particular in a projection exposure apparatus for lithography utilizing extreme-ultraviolet light (EUV lithography).

Microlithography is used for the production of microstructured components such as for example integrated circuits or LCDs. The microlithography process is carried out in what is referred to as a projection exposure apparatus which has an illumination system and a projection objective. The image of a mask (i.e., reticle) illuminated by the illumination system is projected in that case by the projection objective onto a substrate (for example a silicon wafer) which is coated with a light-sensitive layer (i.e., photoresist) and arranged in the image plane of the projection objective in order to transfer the mask structure onto the light-sensitive coating on the substrate.

In projection exposure apparatuses designed for the EUV range, that is to say at wavelengths of for example about 13 nm or about 7 nm, mirrors are used as optical components for the imaging process due to the lack of availability of suitable translucent refractive materials. As the service life of the mirrors or the projection exposure apparatus designed for operation under EUV conditions is limited due to contaminating particles or gases, in particular hydrocarbon compounds, operation of the projection exposure apparatus or individual parts of the housing is required under vacuum conditions (for example at total pressures of $10^{-3}$ mbars or below).

In that respect however the problem occurs in practice that the contaminants which are propagated in the system can adhere to the surfaces of the optical elements, which in turn results in an adverse effect on the optical properties of the elements, that is to say a loss of reflection of the mirrors.

WO 2008/034582 A2 and DE 10 2006 044 591 A1 disclose inter alia an optical arrangement, in particular a projection exposure apparatus for EUV lithography, which, to reduce the adhesion of contaminants, in particular to reflective optical elements, has within an evacuated housing at least one further vacuum housing surrounding the optical surface of the respective reflective optical element. Associated with the vacuum housing is a contamination reduction unit which reduces the partial pressure of contaminating substances such as water and/or hydrocarbons at least in the immediate proximity of the optical surface. In that way a kind of "mini-environment" is generated around the optical surface, with a reduced number of contaminating particles, so that fewer particles can be deposited on the optical surface.

US 2009/0135386 A1 discloses inter alia the provision of a plurality of subchambers in an illumination system of a projection exposure apparatus within a vacuum chamber, the chambers being separated from each other by way of separating walls provided with a passage opening therethrough and respectively arranged at positions of minimum light cross-sectional area or in the proximity thereof, and respectively evacuated by associated vacuum pumps.

US 2009/0141257 A1 discloses inter alia an illumination system of a projection exposure apparatus in which a plurality of subchambers are provided within a chamber and accommodate a plurality of reflective optical elements. The subchambers each accommodate a respective one of the reflective optical elements, whereby higher degrees of evacuation are set by associated vacuum pumps independently of each other in comparison with the outer vacuum housing.

SUMMARY OF THE INVENTION

An object of the present invention is to provide an optical arrangement in an optical system, in particular in a projection exposure apparatus for EUV lithography, which particularly in relation to optical elements movable within the system, permits a reduction in the adhesion of contaminations.

This and other objects are attained by the features of the independent claims.

In an aspect of the invention, an optical arrangement in an optical system, in particular in a projection exposure apparatus for EUV lithography, comprises:
 a housing in which at least one optical element is arranged;
 at least one subhousing which is arranged within said housing and which surrounds at least one beam incident on the optical element in operation of the optical system, wherein the internal space of the subhousing is in communication with the external space of the subhousing by way of at least one opening;
 wherein provided in the region of the opening is at least one flow guide portion which deflects a flushing gas flow passing through the opening from the internal space to the external space of the subhousing, at least once in its direction.

As a consequence of the flow guide portion provided in accordance with the invention, the flushing gas flow passing through the opening is deflected at least once in respect of its direction, that is to say the flow guide portion causes a deflection in comparison with a direct or straight-line flow configuration. This renders it possible to achieve an elongation in the flow path, whereby in turn the suppression rate for contaminants (in particular hydrocarbons) which can penetrate from the outside region into the internal region of the subhousing as a consequence of diffusion can be increased. This aspect of the invention is thus based in particular on the concept of so designing the geometry of the transition or the flow configuration between the internal and external regions of the subhousing that the suppression rate for contaminants which can pass from the external region into the internal region by diffusion is increased.

An increase in that suppression rate can be effected in particular if the flushing gas flow is guided through a structurally delimited portion, the spatial extent of which in the flow direction is at least double, in particular at least three times, further in particular at least four times, its extent in a direction perpendicular to the flow direction. That provides a geometry, that is elongated in relation to the flow direction, in respect of the region through which the flushing gas flow passes, this leading to a significant increase in the suppression rate.

In accordance with a further aspect an optical arrangement in an optical system, in particular in a projection exposure apparatus for EUV lithography, comprises:

a housing in which at least one optical element is arranged;

at least one subhousing which is arranged within said housing and which surrounds at least one beam incident on the optical element in operation of the optical system, wherein the internal space of the subhousing is in communication with the external space of the subhousing by way of at least one opening;

wherein a flushing gas flow passing through the opening from the internal space to the external space of the subhousing passes through a structurally delimited portion whose spatial extent in the flow direction is at least double, preferably at least three times, and even more preferably at least four times, its extent in a direction perpendicular to the flow direction.

Mathematically the above-indicated suppression rate can be defined as the quotient of a contamination partial pressure prevailing outside the subhousing relative to the contamination partial pressure prevailing within the subhousing:

$$R = \frac{p^{cont}_{outside}}{p^{cont}_{within}} \quad (1)$$

For an individual opening the suppression rate R can be calculated by way of the Péclet number as follows:

$$R = e^{Pe} = e^{\frac{Q \cdot l}{A \cdot D \cdot p}} \quad (2)$$

Therein Pe denotes the so-called Péclet number which as a dimensionless number defines the ratio between the quantity of heat transported by way of convection to the quantity of heat transported by way of conduction and can be calculated in accordance with equation (2), wherein Q denotes the fluid flow (in units of mbar l/s), p denotes the contaminant pressure in the external region (in units of mbar), D denotes the diffusion coefficient for contaminants (in units $m^2/s$), A denotes the through-flow area (that is to say the area which is perpendicular to the direction of flow and through which the flushing gas passes, in units of $m^2$) and l is the length of the region through which the flushing gas flows in the flow direction (="suppression length") or the length in the direction along the pressure gradient (in units of m).

The diagrammatic view in FIG. 2f serves to illustrate the foregoing parameters. In FIG. 2f, a flushing gas flow which takes place in the direction of the illustrated block arrow from a region "I" (for example the internal region of a subhousing) into a region "II" (corresponding to the region outside the subhousing) by virtue of a pressure gradient existing in that direction passes in the transition between the regions "I" and "II" through a structurally delimited portion or gap which is defined between two mutually opposite walls and which is of a gap width d and a gap length w. The through-flow area A is the product of the gap width d and the gap length w, wherein l denotes the length of the region through which the flushing gas flows in the flow direction (="suppression length") or the length of the flow path in the flow direction and along the pressure gradient.

In the situation shown in FIG. 2f, the contaminant pressure p acts, with a diffusion coefficient D, in the direction from "II" to "I", that is to say towards the internal region of the subhousing, against the fluid flow Q of the flushing gas flow, that is directed outwardly out of the subhousing, wherein the suppression factor in accordance with the present invention is increased by specific targeted design or optimization of the geometry of the transitional region.

Without the invention being limited thereto, the gap width d can be, for example, between 0.1 and 1.5 cm (to permit actuation of the optical elements and provision of a sufficient allowance for movement) and the gap length w (which for example can involve the circumference of a mirror) can be, for example, between 15 and 200 cm, so that typical values for the through-flow area A can be, for example, between 1.5 and 300 $cm^2$, depending on the size of the optical element or mirror.

In an embodiment the deflection by the flow guide portion is effected through an angle of 90°±20°, preferably 90°±10°, and more preferably 90°±5°.

In an embodiment the flow guide portion deflects the flushing gas flow at least twice, preferably at least three times, through an angle of 90°±20°.

In an embodiment the flow guide portion deflects the flushing gas flow onto a flow path which extends substantially in a meander configuration in at least portion-wise fashion.

Such a meandering path can also be provided as also set forth hereinafter by a plurality of internested subhousings each having at least one through-flow opening being arranged, with the through-flow openings of the subhousings not being aligned with each other. If now an increased pressure is set in the region of the innermost subhousing of that nesting by way of a flushing gas feed connected there, the flushing gas must therefore cover an elongated flow path on the way from the innermost subhousing of the nesting outwardly through the individual through-flow openings.

In an embodiment a flushing gas feed is connected to the at least one subhousing, which puts the internal space of the subhousing under an increased pressure relative to the external space thereof. That provides that the respective internal region within the subhousing or subhousings, in spite of contaminations which are typically present in the external region (for example as a consequence of outgassing components for example of the mask actuator system, the resist which changes chemically as a consequence of exposure and so forth) can be kept clean or substantially contamination-free insofar as the gas flow which occurs by way of the opening or openings between the internal and external regions is from the internal region to the external region and not in the reverse direction.

In that respect an aspect of the invention is based on the realization that, when the arrangement has one or more subhousings which respectively enclose one or more (in particular reflective) optical elements, it is desirable, in regard to the desired reduction in the adhesion of contaminations to the optical elements within the subhousings, if the respective internal regions of the subhousings are put under a relative increased pressure with respect to the external region (which typically is subjected to the effect of high vacuum).

A further advantage of generating an increased pressure in the interior of the one or more subhousings is that heat is carried away from the optical element or elements which is or are present within the respective subhousing and which typically heat up in operation of the optical system, such as for example mirrors, towards the exterior, that is to say to the external environment of the subhousing. In that way it is possible to counteract an unwanted input of heat into the system in the region of the light passage by virtue of the optical elements which increase in temperature but also possibly further elements such as for example hydrogen cleaning elements or heads, and an unwanted change that this involves in the optical properties of the system, insofar as the heat is firstly transferred to the flushing gas and is then transported therewith away towards the exterior.

The configuration wherein the internal space of the subhousing is placed under an increased pressure relative to the external space of the subhousing is not limited to the existence of a flow guide portion but also independently thereof has the above-described advantages so that the present application also embraces arrangements in which the creation of a reduced pressure in the internal space relative to the external space of the subhousing is implemented without deflection of the flushing gas flow.

In accordance with a further aspect therefore the invention also concerns an optical arrangement in an optical system, in particular in a projection exposure apparatus for EUV lithography, comprising:

a housing in which at least one optical element is arranged;
at least one subhousing which is arranged within said housing and which surrounds at least one beam incident on the optical element in operation of the optical system, wherein the internal space of the subhousing is in communication with the external space of the subhousing by way of at least one opening; and
at least one flushing gas feed which is connected to the at least one subhousing and which places the internal space of the subhousing under an increased pressure relative to the external space of the subhousing.

In general in accordance with the present invention the term "optical system" or "optical arrangement" embraces not only systems which are operated with light (for example in the visible range, in the UV range or in the EUV range), but also electron-optical or particle-optical systems which operate with a thin electron or particle beam (which then forms the "ray beam"), for example mask inspection or mask repair systems. Furthermore, in accordance with the present invention, the term "optical element" is used to denote any element (that is to say for example instead of a mirror, also a refractive lens, a prism, a grating or a lithography mask with structures that are to be imaged).

In accordance with a further aspect the invention also concerns a mask inspection system or a mask repair system for a microlithography mask, wherein the system has an optical arrangement according to the invention.

In addition the invention concerns a microlithographic projection exposure apparatus comprising an illumination system and a projection objective, wherein the illumination system and/or the projection objective has an optical arrangement having the above-described features.

In that respect in an embodiment there are provided an optical integrator having a plurality of mirror elements, a first reflecting surface reflecting light reflected by said mirror elements, and a second reflecting surface guiding same from the first reflecting surface to an object plane of the projection objective, wherein a plane optically conjugate in relation to said object plane can be arranged between the optical integrator and the object plane.

In addition in an embodiment there is provided: a separation structure separating a first region in which the first reflecting surface is arranged from a second region in which the second reflecting surface is arranged, wherein the separation structure has an opening permitting illumination light to pass therethrough, and wherein the opening is arranged at least in the immediate proximity of a position at which the cross-section of a beam reflected at the first reflecting surface is at a minimum.

In an embodiment the position at which the cross-section of a beam reflected at the first reflecting surface is at a minimum is disposed in a position optically conjugate with respect to the object plane, in a pupil plane or in a plane optically conjugate with respect to the pupil plane.

In a further aspect the invention concerns a process for the microlithographic production of microstructured components comprising the following: providing a substrate to which a layer of a light-sensitive material is at least partially applied, providing a mask having structures which are to be imaged, providing a microlithographic projection exposure apparatus having the foregoing features, and projecting at least a part of the mask onto a region of the layer with the projection exposure apparatus.

Further configurations of the invention are set forth in the description and the appendant claims.

BRIEF DESCRIPTION OF THE DRAWINGS

The invention is described in greater detail hereinafter with reference to specific embodiments given by way of example and illustrated in the accompanying drawings in which.

DETAILED DESCRIPTION OF SPECIFIC EMBODIMENTS

The concept underlying an aspect of the invention is firstly described hereinafter with reference to the diagrammatic views showing the principles involved in FIGS. 1a-b and FIGS. 2a-f.

FIG. 1a shows a plurality of (in particular reflective) optical elements 110, 120 and 130, wherein the optical elements 110, 120 and 130 can be manipulated in their geometrical position (for example tilted and/or displaced) purely for example by way of manipulators 111, 112, 121, 122, 131 and 132. Cleaning units 150 (for example in the form of so-called hydrogen cleaning heads or modules) which are optionally integrated into the optical arrangement are also only diagrammatically indicated.

Figure 1:
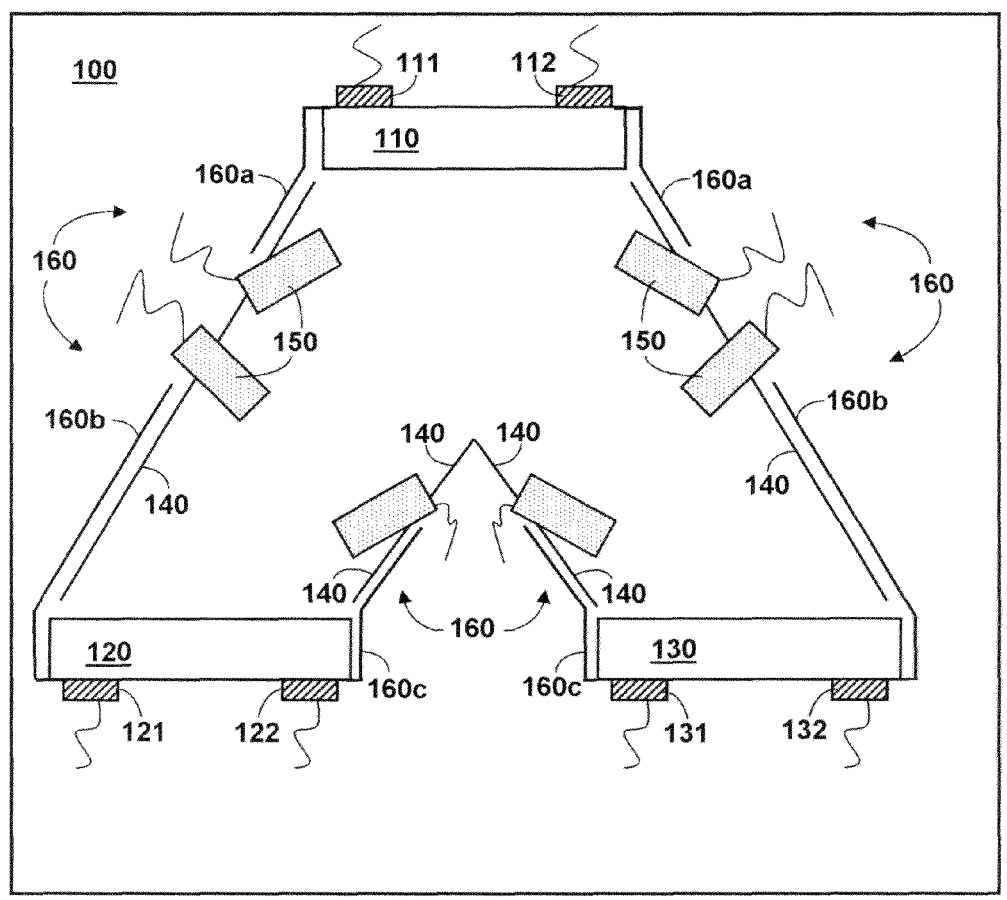
FIGS. 1a-b show diagrammatic views to illustrate the structure of an optical arrangement in accordance with an embodiment of the invention.
Figure 1:
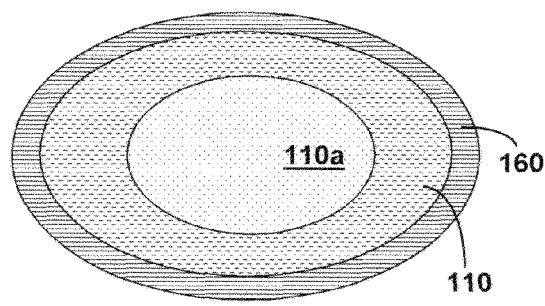

Hereinafter it is assumed that the entire optical arrangement shown in FIG. 1a is in vacuum, for which purpose it is enclosed by an (external) housing 100. Furthermore, as shown in FIG. 1, provided within the housing 100 is a subhousing 140 which accommodates the optical elements 110, 120 and 130 in the form of a "mini-environment", which is previously known per se, from DE 2006 044 591 A1. The illustrated number of three optical elements within the subhousing 140 is only by way of example, in which respect further optical elements which are typically also present outside the subhousing have not been illustrated for simplicity of the view in FIG. 1.

In accordance with the present invention the term "mini-environment" is used to denote a structurally or spatially separated region which permits separate adjustment of the partial pressures of contaminants or other elements contained in that region (that is to say the provision of its own dedicated "vacuum environment"). In that respect that spatially separated region can have openings to permit adjustment of the partial pressures and/or movement of optical elements.

Provided in the region of the optical elements 110, 120 and 130 are certain gap spacings in respect of the subhousing 140 relative to the respective optical elements 110, 120 and 130. Those gap spacings can be for example less than 10 mm, in particular less than 5 mm, further particularly less than 1 mm and permit on the one hand a movement or actuation of the optical elements 110, 120 and 130 by way of the respectively associated manipulators 111, 112, 121, 122, 131 and 132 respectively. On the other hand the gap spacings also permit a permanent (flushing) gas flow out of the internal region of the subhousing 140 into the external region thereof, which is under high vacuum conditions.

To produce or maintain that flushing gas flow, one or more vacuum pumps (not shown in FIG. 1) are connected to the external region to produce a high vacuum of $10^{-5}$ mbars or below, and there is provided a gas feed to the internal region of the subhousing 140, by way of which a suitable flushing gas (for example hydrogen $H_2$) is introduced into that internal region, wherein the $H_2$ (increased) pressure can be for example in the region of $10^{-2}$ mbars. The gas feed can be effected in particular through the cleaning units or parallel thereto. In accordance with the invention therefore the increased pressure can be so adjusted in particular that the pressure in the respective internal region of the subhousing is higher than in the external region of the subhousing at least by a factor of greater than 1, in particular a factor of greater than 10, further particularly a factor of greater than 100. The flushing gas flow which occurs from the internal region of the subhousing 140 to the external region (that is to say to the normal vacuum region in the outer housing 100) is sucked away by the above-mentioned vacuum pumps.

As shown in FIG. 1a, in addition there are additional walls or enclosures in the form of separating walls 160a, 160b and 160c extending along a subregion of the subhousing 140 on the outside thereof. As can also be seen from FIG. 1a, those separating walls 160a, 160b and 160c are so arranged that the flushing gas flow is suitably deflected or guided from the internal region of the subhousing 140 into the external region thereof, that is to say into the normal vacuum region in the outer housing 100, so that this affords an elongate flow path for the flushing gas flow in comparison with a similar arrangement without the separating walls 160a, 160b and 160c.

Although a given geometry for that elongated flow path is only shown in FIG. 1a for explanatory purposes, the invention is not limited to that illustrated geometry. Rather, other suitable geometries leading to deflection or elongation of the flow path such as for example a meander-shape configuration as is also illustrated hereinafter may also be appropriate.

In that respect the aim and purpose of the separating walls 160a, 160b and 160c or the above-mentioned elongation of the flow path is to increase the suppression rate for contaminants (in particular hydrocarbons) which can penetrate from the external region into the internal region of the subhousing 140 as a consequence of diffusion, as described hereinbefore with reference to the equations (1) and (2).

Figure 2:
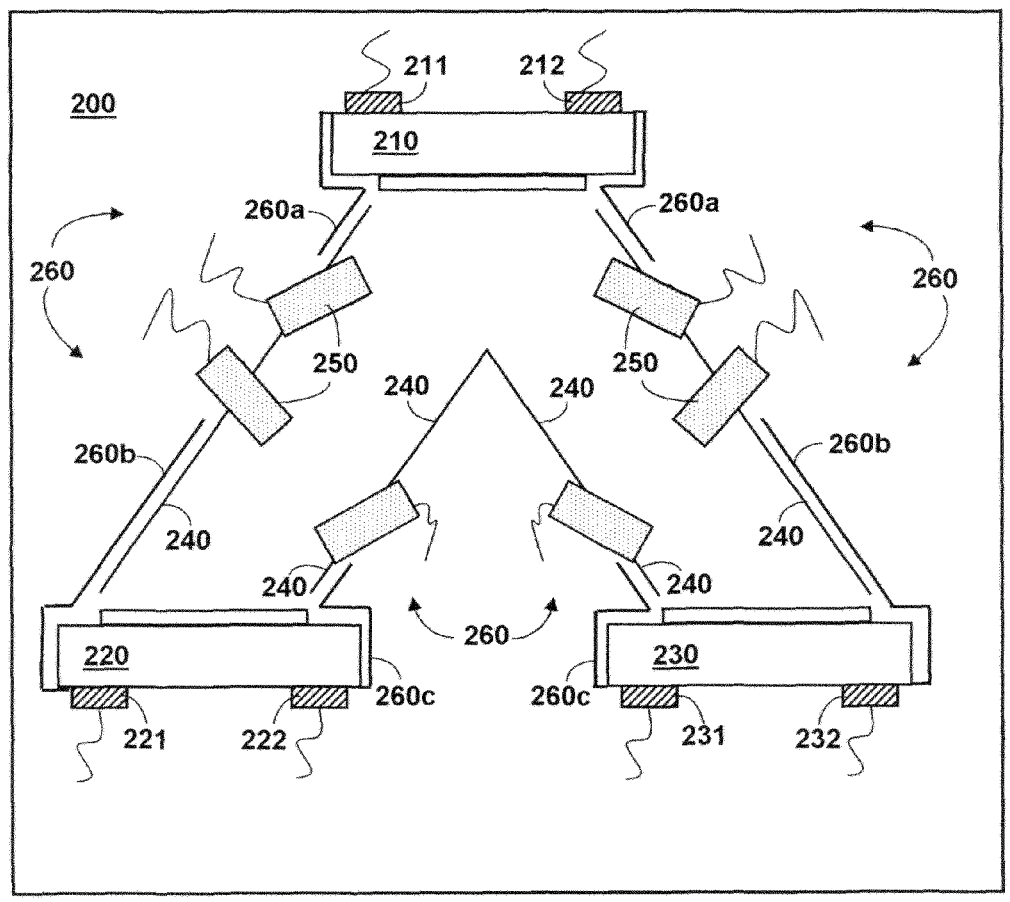
FIGS. 2a-f show diagrammatic views of further embodiments of the invention.
Figure 2:
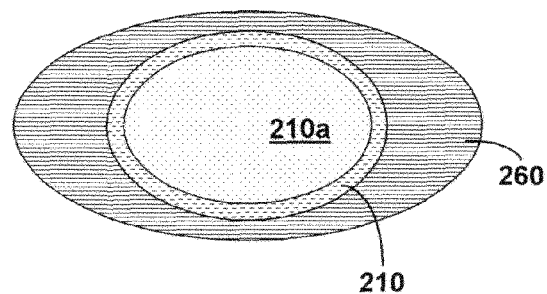

FIG. 2a shows a diagrammatic view of a further optical arrangement wherein, in comparison with the FIG. 1a arrangement, similar components or components of substantially the same function are identified by references increased by "100".

The arrangement in FIG. 2a differs from that shown in FIG. 1a in that the reflecting surfaces of the optical elements 210, 220 and 230 are respectively optically used to a lesser degree and correspondingly adapted or modified geometries are selected for the separating walls 260a, 260b and 260c as well as the flow paths resulting therefrom.

The differences between the arrangements of FIG. 1a and FIG. 2a in respect of the proportion of area of the optical elements 110-130 and 210-230 respectively, that is put to optical use, as well as the configuration of the respective separating walls 160a-160c and 260a-260c are shown once again on an exaggerated scale in FIG. 1b and FIG. 2b respectively, the optically used areas of the respective optical element 110 and 210, being denoted by 110a and 210a respectively.

FIG. 2c-d show an alternative configuration in which an elongation of the flow path is afforded by the flushing gas flow being guided through a region whose spatial extent in the flow direction is at least double (in particular at least three times, further particularly at least four times) the extent in a direction perpendicular to the flow direction. For that purpose a subhousing 270 which, similarly to FIGS. 2a, b, encloses a plurality of optical elements 210', 220' and 230', with which actuators 211', 212', 221', 222', 231', 232' are respectively associated, has peripherally extending and radially outward open "cantilevers" in the form of peripherally extending pairs of wall portions 271 and 272 respectively so that in the region of those cantilevers or wall portions 271, 272, the flushing gas can flow in a radial direction outwardly in a portion which is constricted by the cantilevers or wall portions, into the region outside the subhousing 270.

Figure 2E:
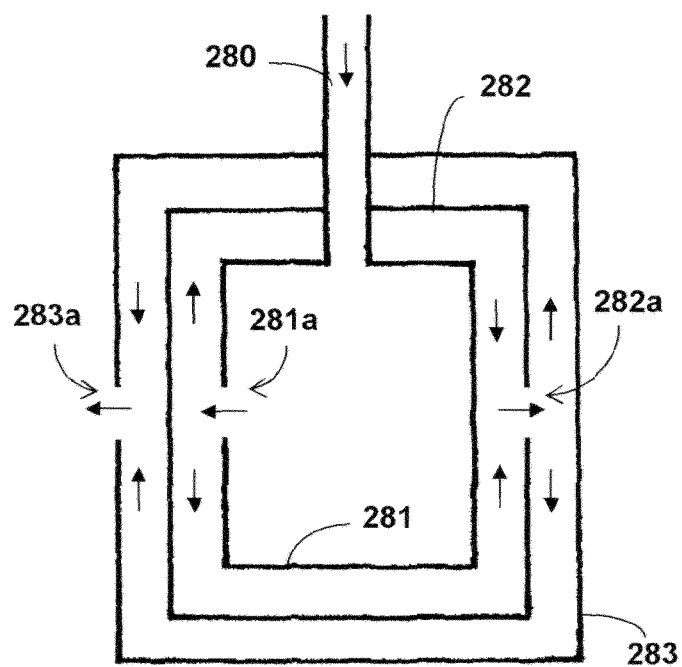
Figure 2F:
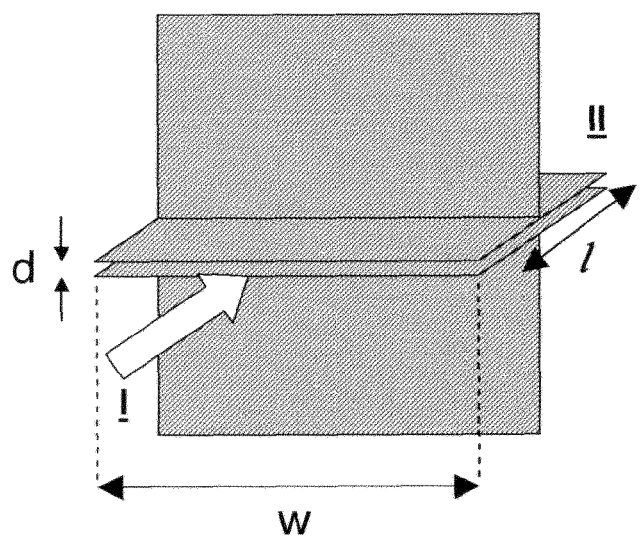

FIG. 2e shows a further alternative configuration in which an elongation of the flow path is afforded by a plurality of internested subhousings 281, 282, 283 (in respect of which the number of three is only by way of example and can also be greater or smaller) with respective through-flow openings 281a, 282a, 283a being so arranged that those openings 281a, 282a, 283a are not aligned with each other, wherein an increased pressure is set by way of a flushing gas feed 280 in the region of the innermost subhousing 281 of the nesting.

As a consequence of the openings 281a, 282a, 283a not being aligned with each other, the flushing gas, as shown in FIG. 2e, on the way from the innermost subhousing 281 to the outermost subhousing 283, also has to cover a flow path which is deflected a multiplicity of times and is thus elongated as a consequence. In that way, once again similarly to the above-described embodiments, the internal space of the subhousing 281 (in which for example an optical element not shown in FIG. 2e can be arranged) can be kept relatively clean of contaminants in the external space due to an increase in the suppression rate for reverse diffusion of such contaminants.

Figure 3:
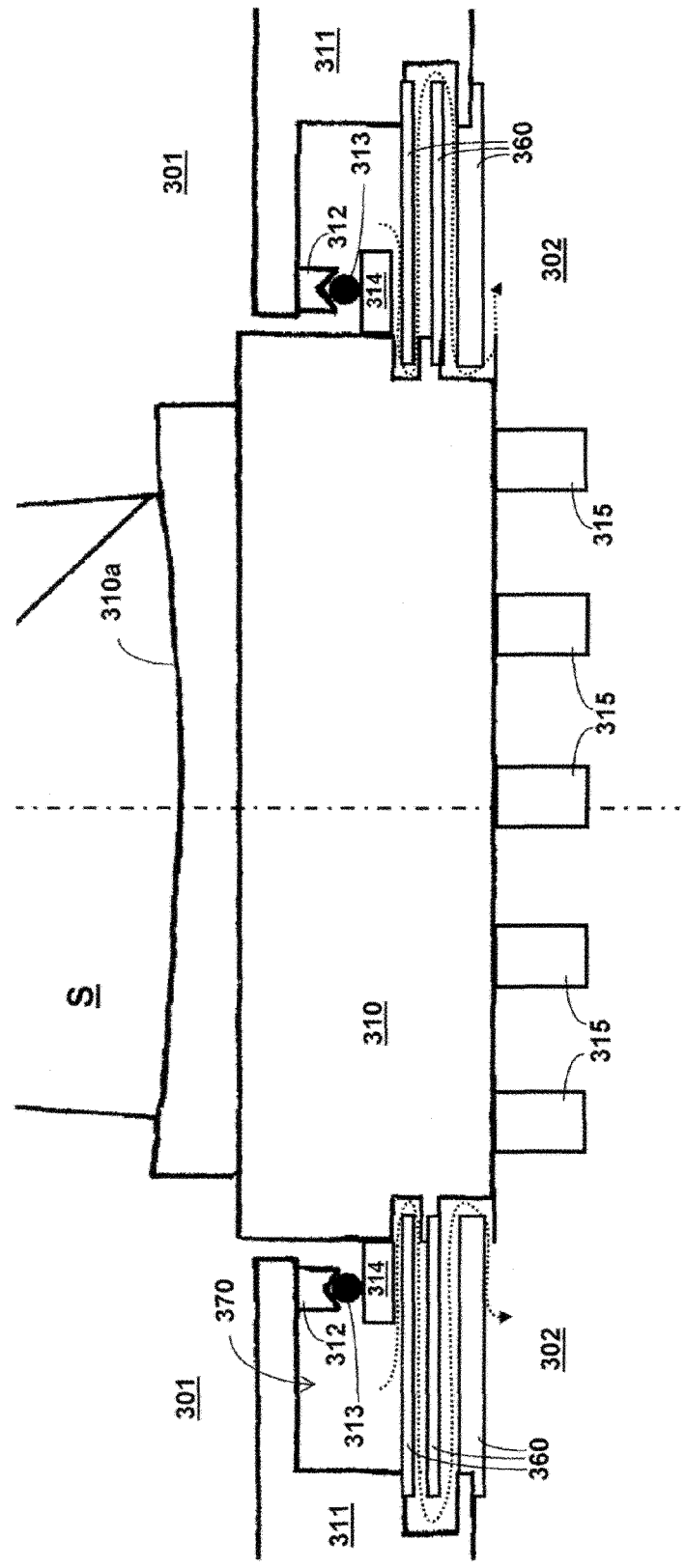
FIGS. 3-4 show diagrammatic views to illustrate further embodiments of the invention in particular in conjunction with movable or actuatable optical elements, FIGS. 5-6a, b show a use of the invention in an illumination system of a microlithographic projection exposure apparatus.

FIG. 3 shows a further diagrammatic view to illustrate a possible implementation of the above-described concept according to the invention in conjunction with a movable or actuatable optical element 310.

The optical element 310 can again be just by way of example a reflecting optical element or a mirror having a reflecting surface 310a, on which a light beam S is incident in the illustrated embodiment. The drawing also shows a holder element 311 to which the optical element 310 is mounted movably by way of a ring seal 313 disposed between suitable projections or abutment surfaces 312 and 314. It will be appreciated that the illustrated configuration is only by way of example and the invention is not limited to arrangements having a ring seal.

In the arrangement in FIG. 3 it is assumed that a relative increased pressure of a suitable flushing gas such as for example hydrogen is on the light entry side of the optical element 310 or the holder element 311 (that is to say upwardly in FIG. 3), whereas on the light exit side of the optical element 310 or the holder element 311 (downwardly therefore in FIG. 3) there is the "normal" high vacuum within the optical system (corresponding to the region outside the subhousing 140 in the housing 100 in FIG. 1).

Furthermore FIG. 3 diagrammatically shows outgassing components 315 disposed in the region of the "normal" vacuum environment within the optical system, in which respect penetration of the contaminants originating from those components 315 into the region 301 to be kept as clean as possible of such contaminants is effectively prevented in the fashion according to the invention.

In order now to increase the suppression rate for the contaminants which diffuse back in opposite relationship to the existing pressure drop (in particular hydrocarbon compounds) in the manner already described with reference to FIG. 1a and FIG. 2a, for the flushing gas flow which occurs as a consequence of the differential pressure, a compression ring 360 is so arranged as shown in FIG. 3 that the compression ring 360 is fixedly clamped or fixed at one side on the one side thereof while on its other side it is arranged in freely hanging relationship at one side so that the flushing gas flow (directed downwardly in FIG. 3) is guided over an elongated flow path. In the illustrated embodiment in FIG. 3 that flow path is of a substantially meandering configuration and is identified by a dotted line.

Figure 4:
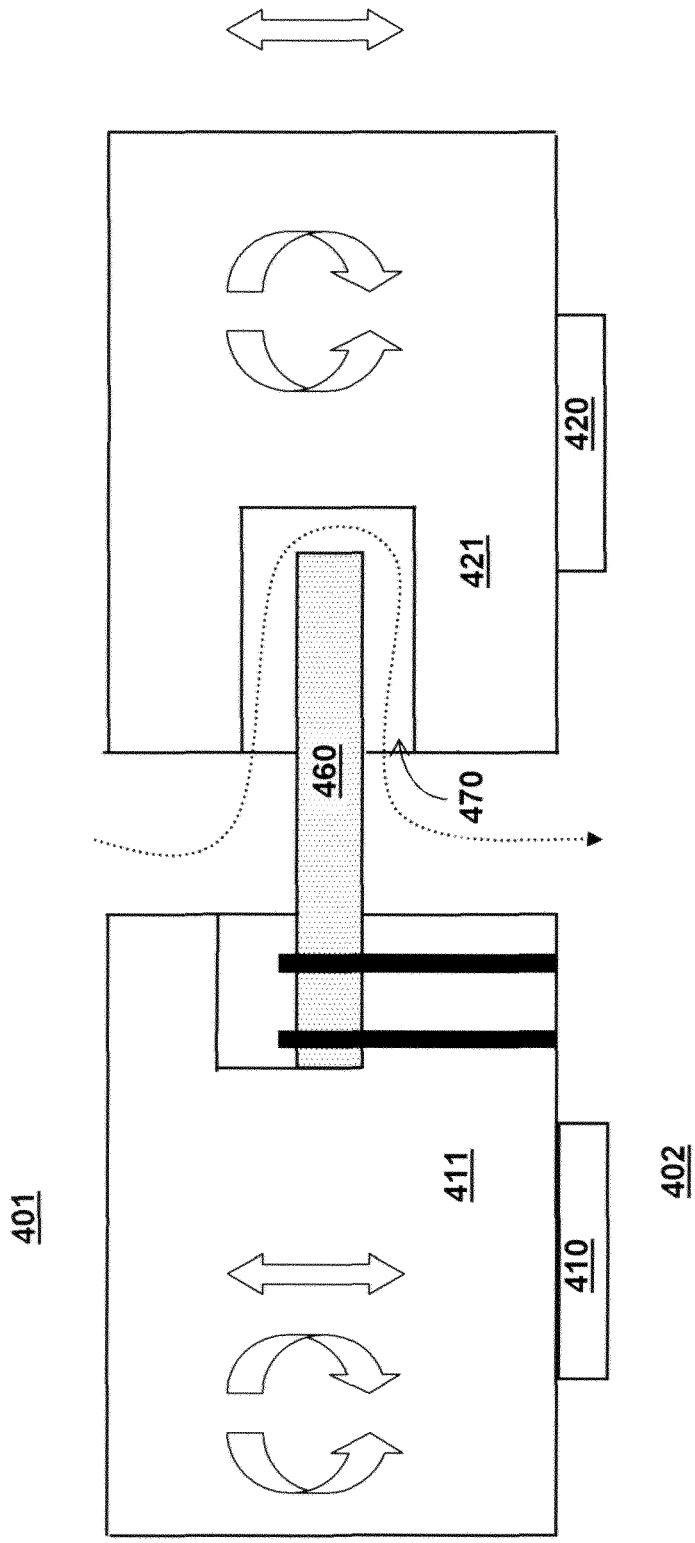

FIG. 4 shows a diagrammatic view of a further optical arrangement according to the invention, in which respect elements or regions similar to FIG. 3 are denoted by references increased by "100".

Referring to FIG. 4 arranged between a first component 411 (for example a mirror) and a second component 421 (for example a component of an outer frame structure) is a compression ring 460 (alternatively for example also a plate-shaped element), in such a way that the compression ring 460 is clamped fast or fixed on one side thereof while on its other side it is arranged in freely hanging relationship, wherein remaining between the compression ring 460 and the second component is a (three-dimensional) gap 470 which, having regard to any tolerances, permits collision-free relative movement of the first component 411. In this example also the flushing gas flow (directed from "above" "downwardly" in FIG. 4) goes by way of an elongated flow path which in the illustrated example is identified by the dotted arrowed line.

Figure 5:
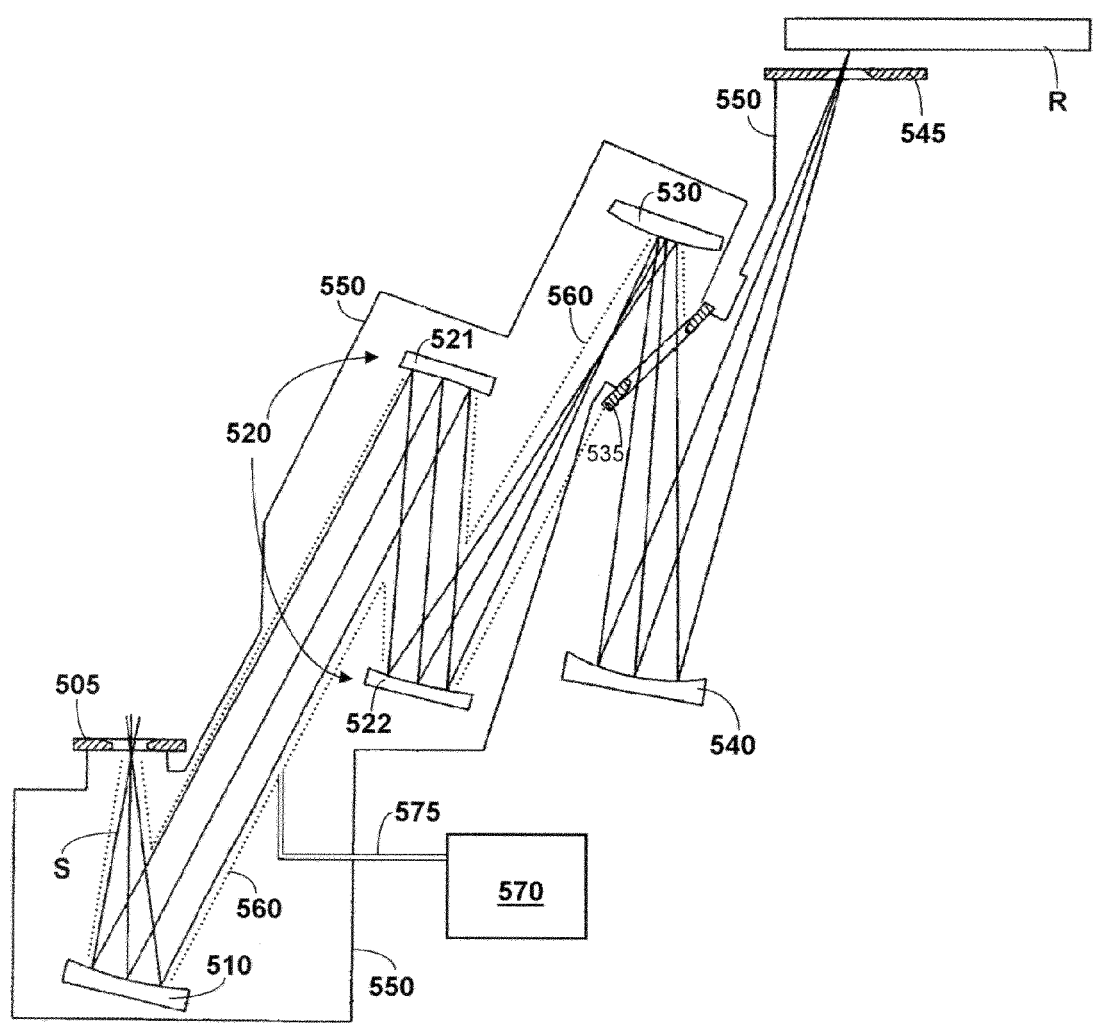

FIG. 5 diagrammatically shows an implementation of the present invention in an illumination system of a microlithographic projection exposure apparatus designed for EUV. The illumination system of which only a part is shown in FIG. 5 has—in the light propagation direction of a light beam S passing through the illumination system—firstly a concave mirror 510 from which the beam S is incident on an optical integrator 520 made up of micro-optical elements in the form of micromirror arrays or optical fly's eye systems 521 and 522.

Figure 6:
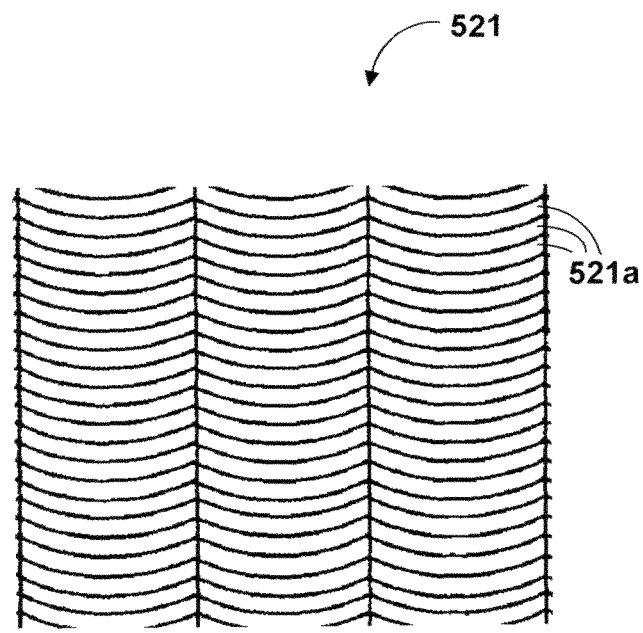
Figure 6:
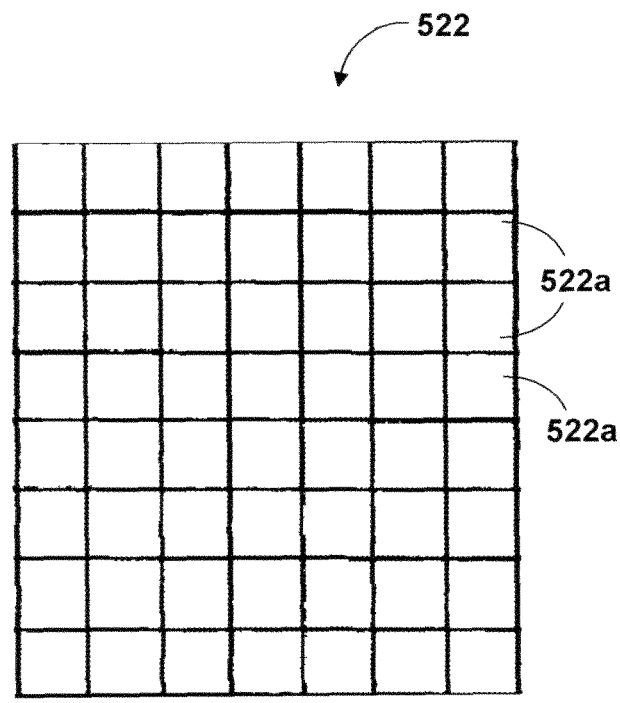

As shown in FIG. 6a the micromirror array 521 can have a multiplicity of mirror elements 521a which are respectively arranged two-dimensionally and are of a geometry in the shape of a circular arc, whereas the second micromirror array 522 as shown in FIG. 6b has a multiplicity of micromirrors 522a which are also arranged two-dimensionally and are of a rectangular geometry.

The basic structure of the optical elements shown in FIG. 5—without the configuration according to the invention which is further described—is described in US No 2009/0135386 A1 and thus as state of the art does not form part of the subject-matter of the present invention.

In the light propagation direction, the optical integrator 520 is followed by a convexly curved mirror 530 at which the beam S is reflected and is incident on a concave mirror 540 after passing through a further aperture plate 535. The light reflected at the concave mirror 540, after passing through a further aperture plate 545, is incident on a reticle R which has structures to be imaged and which is disposed in turn in the object plane of a projection objective of the projection exposure apparatus, which objective is not shown in FIG. 5 but is described in greater detail hereinafter with reference to FIG. 7.

In the structure diagrammatically shown in FIG. 5, the aperture plate 535 thus separates a region having the concavely curved mirror 530 from a region having the concave mirror 540, of the illumination system. In addition the aperture plate 535 is disposed at least in the proximity of the minimum diameter of the beam S. Furthermore the plane in which the aperture plate 535 is disposed forms an optically conjugate plane in relation to the entrance pupil of the projection objective following the illumination system in the beam path.

As shown in FIG. 5 a part of the illumination system which includes all optical elements which in the light propagation direction are arranged downstream of a first aperture, for example the first aperture plate 505, and upstream of the aperture plate 535, is enclosed by a housing 550. In addition, as shown in FIG. 5, disposed within that housing 550 is a subhousing 560 which is shown by dotted lines and which respectively surrounds the beam S. As can also be seen from FIG. 5, provided in the regions of that subhousing 560, that adjoin the reflecting elements 510, 521, 522 and 530 are openings in the form of gaps which provide the required clearance for positional manipulation (for example tilting) of the respective reflecting optical element 510, 521, 522, 530 and 540 respectively. In addition those openings or gaps permit a flushing gas flow out of the region within the subhousing 560 into the region outside the subhousing 560, that is to say into the normal vacuum region in the housing 550 of the illumination system.

A gas feed 570 serves to generate that flushing gas flow, being connected by way of a suitable feed line 575 to the subhousing 560 and producing within the subhousing 560 a comparatively low increased pressure of a suitable high-purity gas (for example hydrogen, $H_2$), so that that flushing gas is propagated in the region embraced by the subhousing 560 and flows by way of these openings or gaps outwardly into the normal vacuum region in the housing 550 of the illumination system.

Figure 7:
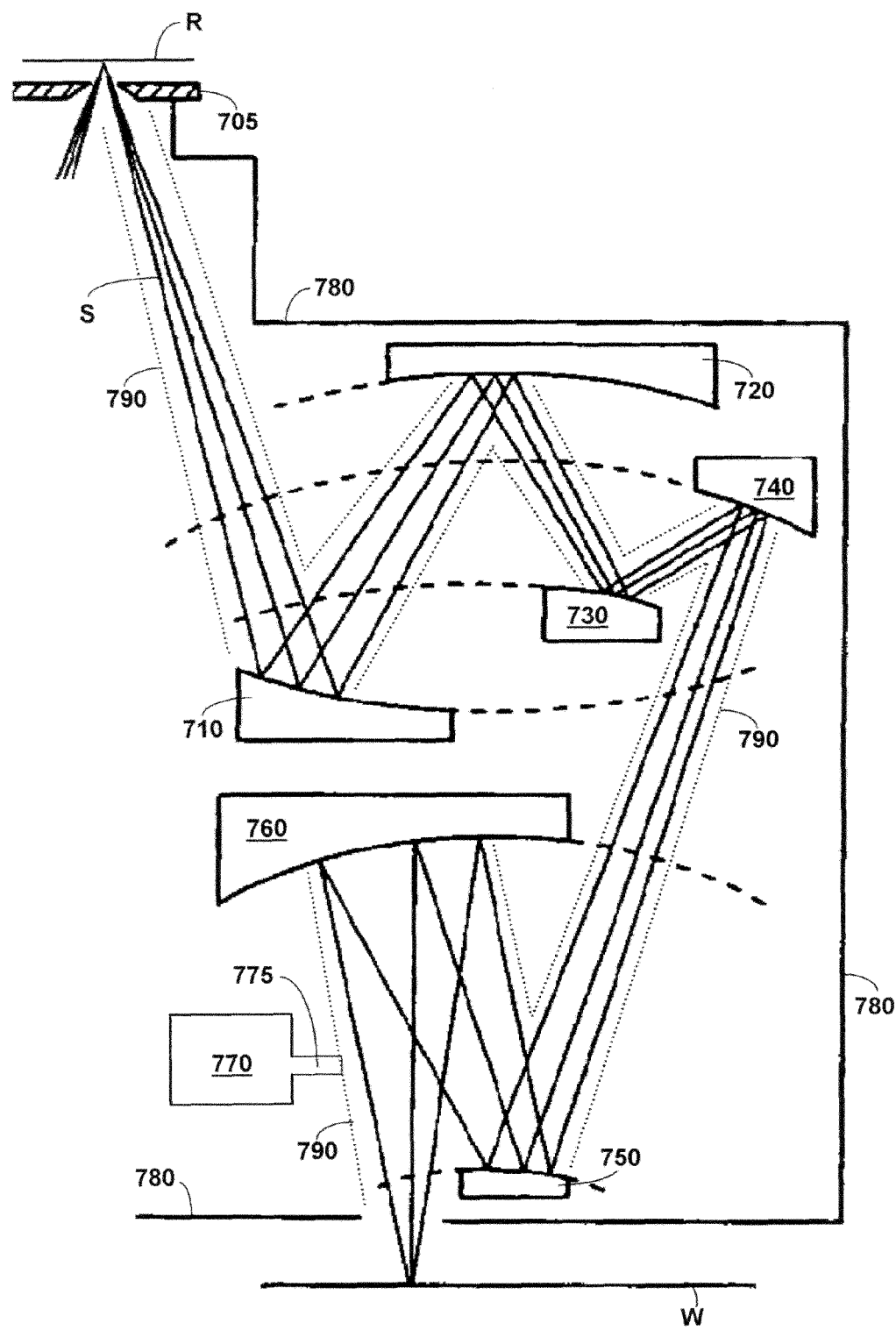
FIG. 7 shows a use of the invention in a projection objective of a microlithographic projection exposure apparatus.

FIG. 7 shows a diagrammatic view of an implementation of the invention in a projection objective of a lithographic projection exposure apparatus designed for operation in the EUV. The fundamental structure of the optical elements shown in FIG. 5—without the configuration according to the invention which is still described hereinafter—is described in US 2009/0135386 A1 and as state of the art is therefore not part of the subject-matter of the present invention.

As shown in FIG. 7 the projection objective is made up of six mirrors 710, 720, 730, 740, 750 and 760 and can have for example a magnification factor of 1:4, wherein the beam path as shown in FIG. 7 does not extend in telecentric relationship at the object side (that is to say on the side of the reticle R) whereas on the image plane side (that is to say on the side of the wafer W) it extends in telecentric relationship. In the illustrated example the mirrors 710, 720, 740 and 760 are concave mirrors and the mirrors 730 and 750 are convex mirrors. The invention however is not limited to that configuration but also embraces configurations with a different number or configuration of the mirrors used.

As shown in FIG. 7 a beam S from the reticle R passes onto the wafer W after reflection at the mirrors 710-760 to produce an image of the structure of the reticle R, that is to be imaged.

In addition as shown in FIG. 7 a subhousing 790 which surrounds the beam S is provided in a similar manner to FIG. 5 within a housing 780 of the projection objective, wherein provided in the respective region adjoining the mirrors 710-760 are openings or gaps which permit positional manipulation (for example tilting) of the respective mirrors 710-760.

The drawing also shows a flushing gas feed 770 which is connected to the subhousing 790 by way of a suitable feed line 775 and produces a flushing gas flow of a suitable high-purity flushing gas (for example hydrogen, $H_2$). That flushing gas flow is propagated in the region enclosed by the subhousing 790, produces within that region a comparatively low increased pressure in relation to the external vacuum environment in the housing 780 of the projection objective and passes outwardly into that vacuum environment by way of said openings or gaps.

Figure 8A:
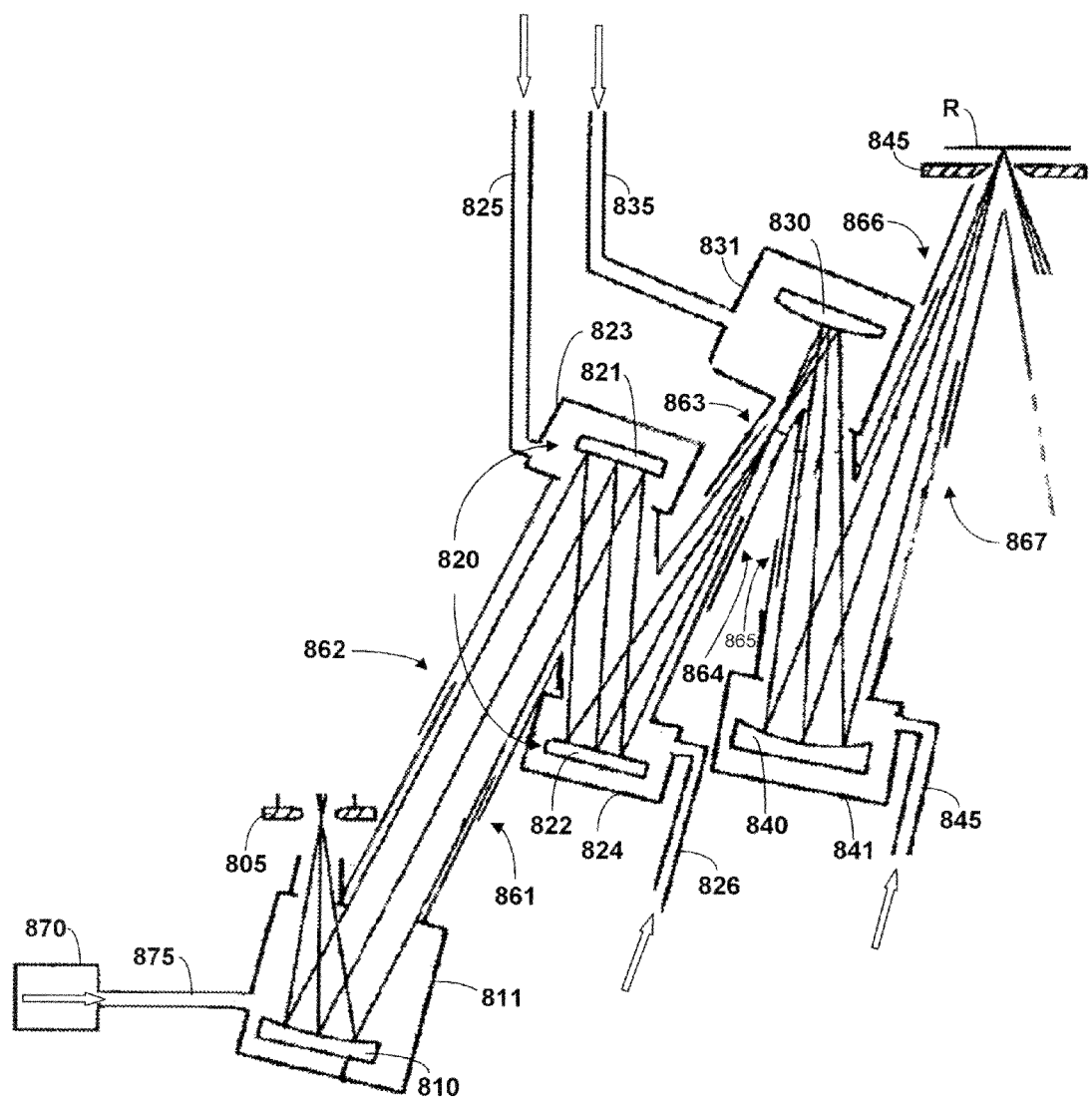
FIGS. 8a-b show a further embodiment of a use of the invention in an illumination system of a microlithographic projection exposure apparatus.

FIG. 8a diagrammatically shows a further embodiment of a further implementation of the invention in an illumination system of a lithographic projection exposure apparatus designed for EUV. In this case, in comparison with the FIG. 5 embodiment, components which are of substantially the same function are denoted by references increased by "300".

The FIG. 8 embodiment differs from the FIG. 5 embodiment in particular in that there is provided a plurality of subhousings 811, 823, 824, 831 and 841 which (in that succession) respectively surround the optical elements bearing references 810, 821, 822, 830 and 840 respectively.

In addition associated with those subhousings 811, 823, 824, 831 and 841 is a respective gas feed for producing a flushing gas flow and a comparatively low increased pressure of a suitable high-purity gas (for example hydrogen, $H_2$), wherein FIG. 8 diagrammatically shows for the subhousing 811 both the gas feed 870 and also the feed line 875 while for the other subhousings 823, 824, 831 and 841 only the associated feed line 825, 826, 835 and 845 respectively is indicated.

As can also be seen from FIG. 8 disposed at the positions identified by references or arrows 861, 862, 863, 864, 865, 866 and 867 respectively, in a similar fashion to FIG. 1a, is a flow guide portion in the form of an overlap region of the walls which are present in that region and which deflects the flushing gas flow passing out of the respective internal space of the subhousings 811, 823, 824, 831 and 841 to the "normal" vacuum environment of the illumination system for the purposes of increasing the suppression factor for contaminants diffusing back into the respective internal region of the subhousings 811, 823, 824, 831 and 841 in the direction from the "normal" vacuum environment, by increasing the "suppression length".

Figure 8B:
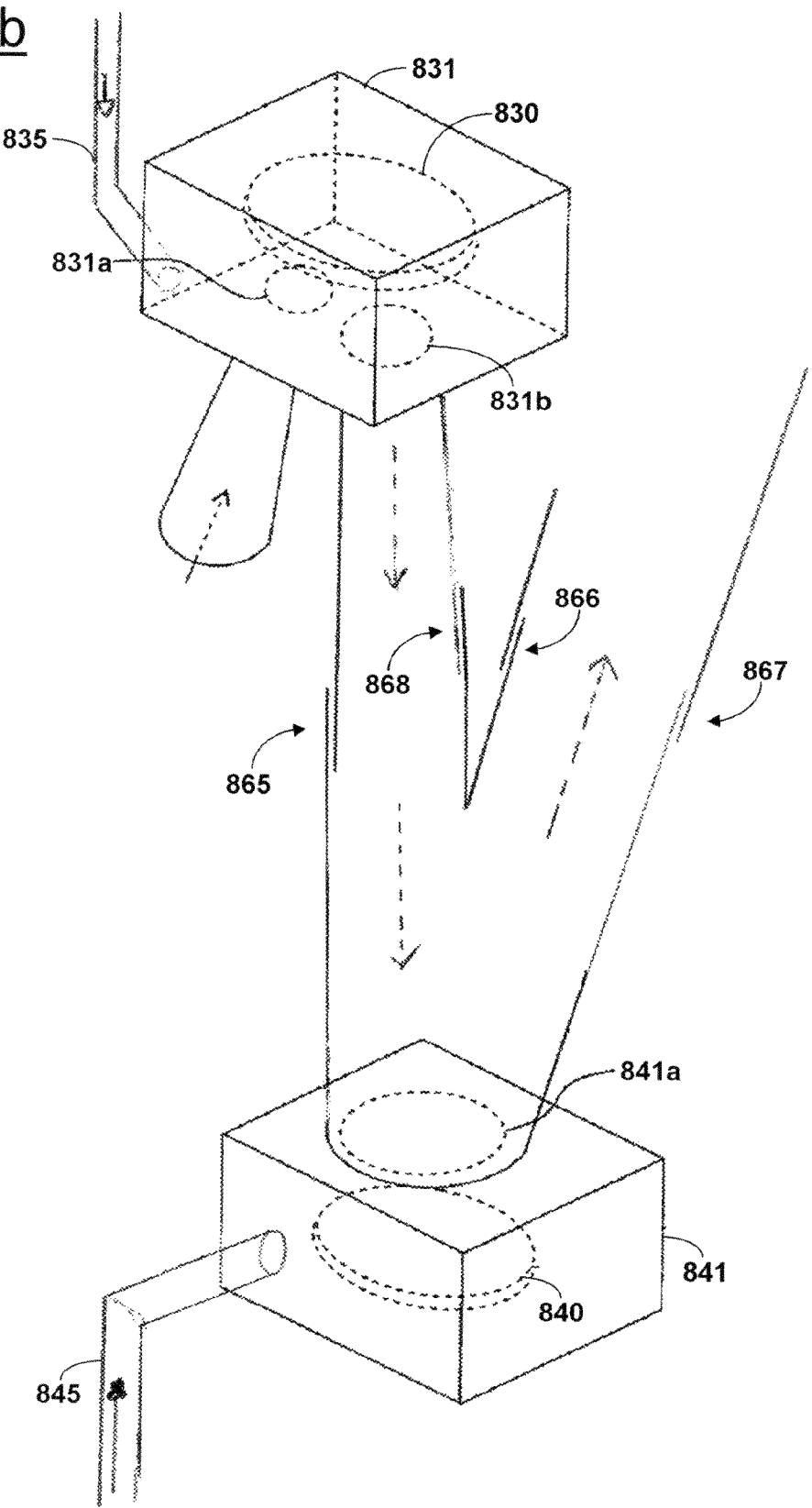

In that respect FIG. 8b shows an enlarged diagrammatic view of the portion of FIG. 8a only in the region of the subhousings 831 and 841. In that respect the subhousings 831 and 841 have suitable openings 831a, 831b and 841a respectively for connection of the wall portions or enclosures surrounding the respective beam.

Even if the invention has been described by reference to specific embodiments, numerous variations and alternative embodiments will be apparent to those skilled in the art, for example by combination and/or exchange of features of individual embodiments. Accordingly it will be appreciated by those skilled in the art that such variations and alternative embodiments are also embraced by the present invention. It is sought, therefore, to cover all such variations and alternatives as fall within the spirit and scope of the invention, as defined by the appended claims, and equivalents thereof.

The invention claimed is:

1. An optical arrangement in a lithographic optical system, comprising:
    a housing in which at least one optical element is arranged;
    at least one subhousing which is arranged within the housing and which surrounds at least one beam incident on the optical element in operation of the optical system, wherein an internal space that is internal to the subhousing and under a first pressure is in communication via at least one opening with an external space that is external to the subhousing but internal to the housing and under a second pressure that is less than the first pressure; and
    at least one flow guide portion extending from the internal space of the subhousing to the external space of the subhousing, wherein the flow guide portion deflects a flushing gas flow passing through the opening from the internal space of the subhousing into the external space of the subhousing at least once.

2. The optical arrangement as claimed in claim 1, wherein the flow guide portion deflects the flushing gas flow at least twice.

3. The optical arrangement as claimed in claim 1, wherein the at least one deflection by the flow guide portion is effected through an angle of $90°\pm20°$.

4. The optical arrangement as claimed in claim 1, wherein the flow guide portion deflects the flushing gas flow onto a flow path which extends substantially in a meander configuration in at least a portion of the path.

5. The optical arrangement as claimed in claim 1, wherein the flushing gas flow passes through a structurally delimited portion, the spatial extent of which in the flow direction is at least double the spatial extent of the portion in a direction perpendicular to the flow direction.

6. An optical system comprising an optical arrangement as claimed in claim 1 and configured as a system for at least one of mask inspection and mask repair of a microlithography mask.

7. A microlithographic projection exposure apparatus comprising an illumination system and a projection objective, wherein at least one of the illumination system and the projection objective comprises an optical arrangement as claimed in claim 1.

8. The microlithographic projection exposure apparatus as claimed in claim 7, further comprising:
    an optical integrator comprising a plurality of mirror elements;
    a first reflecting surface reflecting light reflected by the mirror elements; and
    a second reflecting surface guiding the light reflected from the first reflecting surface to an object plane of the projection objective;
    wherein a plane optically conjugate in relation to the object plane is arranged between the optical integrator and the object plane.

9. The microlithographic projection exposure apparatus as claimed in claim 8, further comprising:
    a separation structure separating a first region in which the first reflecting surface is arranged from a second region in which the second reflecting surface is arranged,
    wherein the separation structure has an opening permitting illumination light to pass thereto; and
    wherein the opening is arranged at least in immediate proximity to a position at which the cross-section of a beam reflected at the first reflecting surface is at a minimum.

10. The microlithographic projection exposure apparatus as claimed in claim 9, wherein the position at which the cross-section of the beam reflected at the first reflecting surface is at a minimum is disposed in a position optically conjugate with respect to the object plane, in a pupil plane or in a plane optically conjugate with respect to the pupil plane.

11. A process for microlithographic production of microstructured components comprising:
providing a substrate to which a layer of a light-sensitive material is at least partially applied;
providing a mask having structures to be imaged;
providing a microlithographic projection exposure apparatus as claimed in claim 7; and
projecting at least a part of the mask onto a region of the layer with the projection exposure apparatus.

12. The optical arrangement as claimed in claim 1, wherein the flow guide portion deflects a flushing gas flow passing through the opening from the internal space of the subhousing directly into the external space of the subhousing.

13. The optical arrangement as claimed in claim 1, wherein the subhousing is arranged entirely within the housing.

14. The optical arrangement as claimed in claim 13, wherein the first pressure is greater than $10^{-3}$ mbar.

15. The optical arrangement as claimed in claim 1, wherein the second pressure is a high vacuum of under $10^{-5}$ mbar.

16. An optical arrangement in lithographic optical system comprising:
a housing in which at least one optical element is arranged;
at least one subhousing which is arranged within the housing and which surrounds at least one beam incident on the optical element in operation of the optical system, wherein an internal space that is internal to the subhousing and under a first pressure is in communication via at least one opening with an external space that is external to the subhousing but internal to the housing and under a second pressure that is less than the first pressure; and
at least one flow guide portion extending from the internal space of the subhousing to the external space of the subhousing;
a structurally delimited portion configured to pass a flushing gas flow through the opening from the internal space of the subhousing to the external space of the subhousing, wherein the spatial extent of the portion in the flow direction is at least double the spatial extent of the portion in a direction perpendicular to the flow direction.

17. The optical arrangement as claimed in claim 16, wherein the spatial extent of the structurally delimited portion in the flow direction is at least four times the spatial extent in the direction perpendicular to the flow direction.

18. The optical arrangement as claimed in claim 16, wherein the opening is a gap between the optical element and the subhousing sufficient to permit positional manipulation of the optical element.

19. The optical arrangement as claimed in claim 16, further comprising at least one wall which is arranged within the housing and which at least one of: (i) partially overlaps the subhousing and (ii) extends portion-wise substantially parallel thereto.

20. The optical arrangement as claimed in claim 19, wherein the flow guide portion is at least partially provided between the subhousing and the wall.

21. The optical arrangement as claimed in claim 16, comprising a plurality of internested subhousings, each having at least one through passage opening, wherein the through passage openings of at least two of said subhousings are not aligned with each other.

22. The optical arrangement as claimed in claim 16, wherein a transitional region between the internal space of the subhousing and the external space of the subhousing is configured to provide a suppression factor of at least 5, where the suppression factor is defined as the quotient (R) between the contamination partial pressure $P_{outside}^{cont}$ prevailing in the external space of the subhousing and the contamination partial pressure $P_{within}^{cont}$ prevailing in the internal space of the subhousing:

$$R = \frac{P_{outside}^{cont}}{P_{within}^{cont}}.$$

23. The optical arrangement as claimed in claim 16, further comprising a flushing gas feed connected to the at least one subhousing, wherein the feed places the internal space of the subhousing under an increased pressure relative to the external space of the subhousing.

24. An optical arrangement in lithographic optical system, comprising:
a housing in which at least one optical element is arranged;
at least one subhousing which is arranged within the housing and which surrounds at least one beam incident on the optical element in operation of the optical system, wherein an internal space that is internal to the subhousing and under a first pressure is in communication via at least one opening with an external space that is external to the subhousing but internal to the housing and under a second pressure that is less than the first pressure via at least one opening;
at least one flow guide portion extending from internal space of the subhousing to the external space of the subhousing; and
at least one flushing gas feed connected to the at least one subhousing and placing the internal space of the subhousing under an increased pressure relative to the external space of the subhousing.

25. The optical arrangement as claimed in claim 24, comprising a plurality of subhousings, each of which surrounds at least one optical element.

26. The optical arrangement as claimed in claim 24, further comprising at least one manipulator configured to manipulate a positioning of the at least one optical element.

27. The optical arrangement as claimed in claim 24 and designed for a working wavelength of less than 15 nm.

28. An optical arrangement in a lithographic optical system, comprising:
a housing in which at least one optical element is arranged;
at least one subhousing which is arranged within the housing and which surrounds at least one beam incident on the optical element in operation of the optical system, wherein an internal space that is internal to the subhousing and under a first pressure is in communication via at least one opening with an external space that is external to the subhousing but internal to the housing and under a second pressure that is less than the first pressure; and
at least one flow guide portion extending from internal space of the subhousing to the external space of the subhousing;
wherein a transitional region between the internal space of the subhousing and the external space of the subhousing is configured to provide a suppression factor of at least 5, where the suppression factor is defined as the quotient (R) between the contamination partial pressure $P_{outside}^{cont}$ prevailing in the external space of the subhousing and the contamination partial pressure $P_{within}^{cont}$ prevailing in the internal space of the subhousing:

$$R = \frac{P_{outside}^{cont}}{P_{within}^{cont}}.$$

* * * * *

UNITED STATES PATENT AND TRADEMARK OFFICE
CERTIFICATE OF CORRECTION

PATENT NO. : 9,041,905 B2  
APPLICATION NO. : 13/414367  
DATED : May 26, 2015  
INVENTOR(S) : Dirk Heinrich Ehm Page 1 of 1

It is certified that error appears in the above-identified patent and that said Letters Patent is hereby corrected as shown below:

In the Specification:
Column 3; Line 45; delete "I" and insert -- 1 --.

Column 3; Line 60; delete "I" and insert -- 1 --.

Column 10; Line 45; delete "that that" and insert -- that --.

In the Claims:
Column 14; Line 31-32; In Claim 24; delete "pressure via at least one opening;" and insert -- pressure --.

Column 14; Line 33; In Claim 24; after "from" insert -- the --.

Signed and Sealed this
Tenth Day of May, 2016

Michelle K. Lee
*Director of the United States Patent and Trademark Office*